United States Patent [19]

Faris

[11] E Re. 31,485

[45] Reissued Jan. 3, 1984

[54] WAVEFORM TRANSITION SENSITIVE JOSEPHSON JUNCTION CIRCUIT HAVING SENSE BUS AND LOGIC APPLICATIONS

[75] Inventor: Sadeg M. Faris, Yorktown Heights, N.Y.

[73] Assignee: International Business Machines Corporation, Armonk, N.Y.

[21] Appl. No.: 252,657

[22] Filed: Apr. 9, 1981

Related U.S. Patent Documents

Reissue of:

[64] Patent No.: 4,149,097
Issued: Apr. 10, 1979
Appl. No.: 865,815
Filed: Dec. 30, 1977

[51] Int. Cl.[3] ..... H03K 19/195; H03K 5/153

[52] U.S. Cl. ..... 307/476; 307/277; 307/462

[58] Field of Search ..... 307/462, 476, 277, 245, 307/306; 365/162

[56] References Cited

U.S. PATENT DOCUMENTS 3,750,153 7/1973 Testardi ..... 307/306
4,051,393 9/1977 Fulton ..... 307/306

OTHER PUBLICATIONS

B. S. Landman, "Josephson Device Equality Comparator" IBM Technical Disclosure Bulletin, vol. 15, No. 5, Oct. 1972, p. 1528.

*Primary Examiner*—John Zazworsky
*Attorney, Agent, or Firm*—T. J. Kilgannon

[57] ABSTRACT

A waveform transition sensitive Josephson junction circuit having sense bus and logic applications is disclosed. In a preferred embodiment, a device capable of carrying Josephson current is shunted by a utilization circuit. Current flowing in the device is diverted to the utilization circuit in response to only one of a pair of transitions of a pulsed input applied to the device. On one transition of the applied pulsed input current, a current is induced in a current path which follows the input until the threshold of a switchable device in the current path is exceeded. The switchable device switches and the induced current drops to zero. If the current generated by the transition is in the opposite direction to current in the Josephson device, the Josephson device remains in its unswitched state. On the other transition of the pulsed input, the induced current follows the input and appears as an oppositely directed current in the Josephson device causing it to switch and deliver current to the utilization circuit. The switching of the switchable device when its threshold is exceeded reduces the induced current to zero. The current applied to the Josephson device and the input applied thereto may both be derived from pulsed sources with the Josephson devices of the circuit operating in latching or self-resetting modes.

45 Claims, 7 Drawing Figures

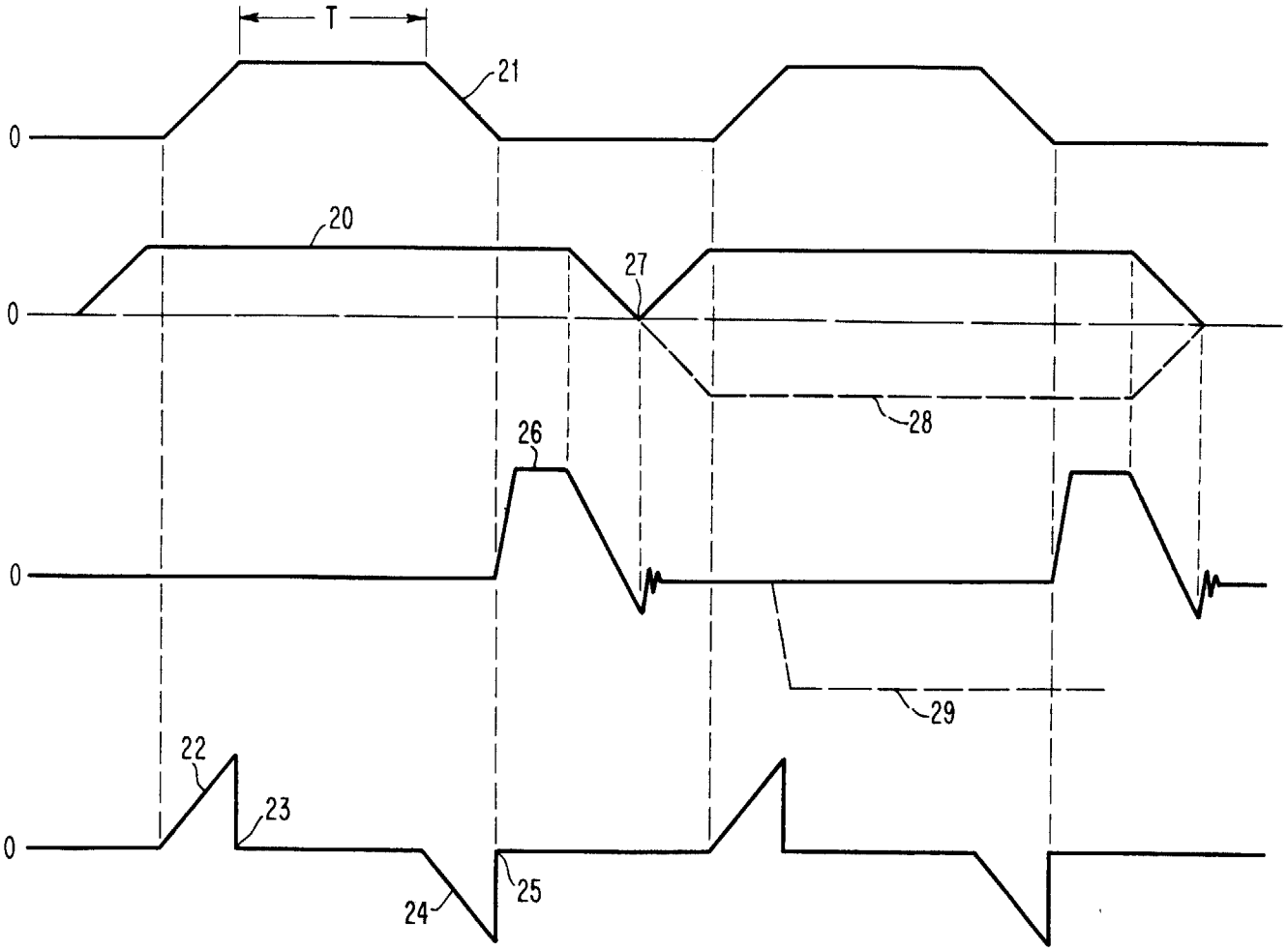
FIG. 2A $I_S$
FIG. 2B $I_{SB}$
FIG. 2C $I_{RL}$
FIG. 2D $I_C$
0
0
0
0
T
20
21
22
23
24
25
26
27
28
29

WAVEFORM TRANSITION SENSITIVE JOSEPHSON JUNCTION CIRCUIT HAVING SENSE BUS AND LOGIC APPLICATIONS

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates generally to circuits which are sensitive to waveform transition and which are capable of delivering an output to a utilization circuit during only one of two waveform transitions of an applied input pulse. More specifically, it relates to waveform transition sensitive circuits which utilize Josephson junctions and the ability of the latter to switch regardless of current direction to apply either an additive or subtractive current to a current already flowing in another Josephson device, the switching of which can deliver a current to a utilization device.

Still more specifically, it relates to the incorporation of such waveform transition sensitive circuits in a sense bus for Josephson random access memory arrays. Sensing is carried out in the absence of timing signals and, because the circuit can be powered by pulsed current, resetting of the sense bus is automatic. Still more specifically, it relates to logic circuits such as AND, OR circuits which may be developed by using a plurality of input circuits all of which provide currents which may be added to or subtracted from a current flowing in a Josephson device which can be delivered to a utilization circuit and represent a desired logic function depending upon how the various currents are manipulated. The resulting circuits which are preferably latching in character provide advantages which include reasonably wide margins, fast operation and, in the instance of the sense bus, a reduction in access time.

2. Description of the Prior Art

U.S. Pat. No. 3,292,160 in the name of Crittenden filed June 6, 1957 shows a circuit which includes a pair of cryotrons disposed in parallel. Using appropriate circuity, circulating currents of opposite polarity can be set up in the loop. Their polarity can be sensed by applying a negative sense pulse to the loop to which the circulating currents add or subtract. Where the applied current is additive with the circulating current, it causes one of the cryotrons to switch and provides a voltage pulse to a sense circuit. Where the applied pulse is subtractive, no switching occurs and no output pulse is provided. This circuit, while it shows the addition and subtraction of a circulating current with another current, it is not responsive to the waveform transitions of a single pulse which, with a transition of one direction, produces no output but, with a transition of the other direction, does produce an output. In the patent, circulating current is already present, whereas in the present application, no circulating currents need be involved and the present circuit is responsive to waveform transitions whereas the circuit of the patent is responsive to the overall polarities of the applied pulses which set up either clockwise or counterclockwise circulating currents in a superconducting loop.

U.S. Pat. No. 2,949,602 in the name of Crowe filed Apr. 11, 1958 utilizes two cryotrons in a single loop. The application of a rising input induces circulating currents in the loop, switching one of the cryotrons and producing an output pulse of one polarity. If the input is applied having opposite polarity, opposite polarity output pulses are produced. The circuit of Crowe is transition sensitive, but operates in the same manner for rising and falling currents. While its outputs are repre;sentative of the transition direction of the inputs, it does not have the capability of switching for one transition of input current but not for the other transition as does the present circuit.

U.S. Pat. No. 3,987,309 in the name of Hamel et al filed Dec. 23, 1974 shows a sensing circuit which works on the principal of shunting gate currents from one branch into another by causing the Josephson junction to switch. At a later time, logic inputs propagate current toward the Josephson device which is now in the zero voltage state having reset after switching. The current in the Josephson device which is now due to the switching of other logic devices acts as a control current for a Josephson sense device which switches when gate current is applied to the Josephson sense device. This sense circuit is not responsive to the waveform transitions of an input signal.

U.S. Pat. No. 3,164,808 in the name of Rogers et al filed May 2, 1960 shows a switchable device shunted by a loop containing an inductance. The arrangement works on the basis of having circulating current or no circulating current in the loop to represent binary states. To read information from a cell, a pulse is applied which switches the switchable device (cryotron) interrupting circulating current and causing it to decay with a time constant L/R. If there is no circulating current in the loop, there is no output. This circuit is not responsive to the waveform transitions of a single input pulse. Rogers et al like Crowe induces circulating currents; the direction of which is a function of the rise or fall of a signal applied to a superconducting loop. Circulating currents can only appear when the switchable device is not resistive.

IBM Technical Disclosure Bulletin, Vol. 17, No. 1, June 1974, p. 259 in an article by W. Anacker et al entitled, "Transformer Coupled Power Supply for Josephson Tunneling Logic Circuits" shows the transformer coupling of power into logic circuits. A loop contains a pair of Josephson devices both of which are subject to the same gate currents by transformer coupling. One of the devices has a diode-like characteristic which is utilized to eliminate circulating currents so that the logic device can be reset. The diode device interrupts the superconductivity of a loop for current flowing counterclockwise while it remains superconducting for current flowing clockwise. This circuit is not responsive to the waveform transitions of an applied input as can be seen from the fact that the loop device of the present application switches for both waveform transitions.

SUMMARY OF THE INVENTION

In accordance with the broadest aspect of the present invention, a waveform transition sensitive circuit is utilized which includes a device capable of carrying Josephson current and a current source connected to the device to provide current flow therein of a given polarity. It also includes a utilization circuit connected to the device and at least a source of current pulses each of the pulses undergoing at least a pair of waveform transitions. Finally, it includes means connected to the device and to at least the source of current pulses responsive to at least a pair of waveform transitions for generating at least transition currents of given and opposite polarity in said device to switch it and deliver the current to the utilization device with the current of the device and the transition current are of the same polarity.

In accordance with the broader aspects of the present invention, a waveform transition sensitive circuit is utilized wherein the source of current pulses is either a source of unipolar or bipolar current pulses.

In accordance with the broader aspects of the present invention, a waveform transition sensitive circuit is utilized wherein the source of current pulses includes a current sensing circuit which incorporates a sense line; a plurality of switchable devices capable of carrying Josephson current disposed in series in the sense line; each of the switchable devices being actuated by current flow in an associated memory cell. It also utilizes a current source connected to the sense line, a controllable switchable Josephson device connected in series with the current source and in parallel with the sense line and transformer means connected in series with the plurality of switchable devices.

In accordance with the broader aspects of the present invention, a waveform transition sensitive circuit is utilized wherein the means for generating transition currents includes at least a current path shunting the device; transformer means disposed in the at least a current path connected to the at least a source of current pulses and, at least a switchable device capable of carrying Josephson current disposed in the at least a current path adapted to switch each time it encounters a polarity transition.

In accordance with the more specific aspects of the present invention, a waveform transition sensitive circuit is utilized wherein the utilization circuit includes a load impedance shunting the device. In accordance with still more specific aspects of the present invention, a waveform transition sensitive circuit is utilized wherein the utilization circuit includes a transducer element disposed in series with the device; the transducer element and the device being connected to the current source.

In accordance with still more specific aspects of the present invention, a waveform transition sensitive circuit is utilized which further includes a drive device capable of carrying Josephson current disposed in series with the current source and in parallel with the driver and the transducer element.

In accordance with still more specific aspects of the present invention, a waveform transition sensitive circuit is provided wherein the threshold current of the device is greater than the threshold current of the switchable device disposed in the current path and adapted to switch each time it encounters a waveform transition.

It is, therefore, an object of this invention to provide a waveform transition sensitve circuit which has application as a sense bus for random access memories and as a logic circuit.

Another object is to provide a waveform transition sensitive circuit which has amplification capability.

Still another object is to provide a waveform transition sensitive circuit in the sense bus regime which resets automatically whenever sense lines are reset and which eliminates critical timing signals during the read operation.

Yet another object is to provide a waveform transition sensitive circuit which, in sense bus applications, provides a significant reduction in access time.

The foregoing and other objects, features and advantages of the invention will become apparent from the following more particular description of the preferred embodiment of the invention as illustrated in the accompanying drawings.

BRIEF DESCRIPTION OF THE DRAWINGS

FIG. 1 shows alternative ways of applying a pulse input to the current injection interferometer and further shows a current path which can include a small resistance with assures the damping of stray circulating currents.

FIGS. 2A–2D show respectively the current waveform $I_S$ applied as an input to the circuit of FIG. 1; the current waveform $I_{SB}$ applied to the current injection interferometer of FIG. 1; the output current waveform $I_{RL}$ developed in the load impedance of the circuit of FIG. 1 and, the transition currents $I_C$ flowing in the circuit of FIG. 1 which can be additive or subtractive with current $I_{SB}$.

In FIG. 3, the switching of a device of a waveform transition sensitive circuit interrupts current in the sense bus causing a current transition therein which is sensed by an output waveform transition sensitive circuit.

Referring now to FIG. 1, there 1 shown therein a schematic diagram of a waveform transition sensitive circuit which diverts current flowing in a given direction in a current injection Josephson interferometer into an output load impedance when one of the current transitions of an input pulse provides a current $I_C$ which is additive with current $I_{SB}$ already flowing in the interferometer.

Referring now to FIG. 1 in more detail, waveform transition sensitive circuit 1 includes a current injection Josephson interferometer J1 disposed in series with a pulsed current source 2 which causes a current $I_{SB}$ to flow in interferometer J1 when that device is in its zero voltage state. Interferometer J1 is shunted by a load impedance 3 otherwise identified as RL in FIG. 1. Interferometer J1 has an injection terminal 4 via which transition currents $I_C$ may be injected into interferometer J1. A current path 5 is connected to injection terminal 4 in parallel with the remainder of interferometer J1.

Figure 1:
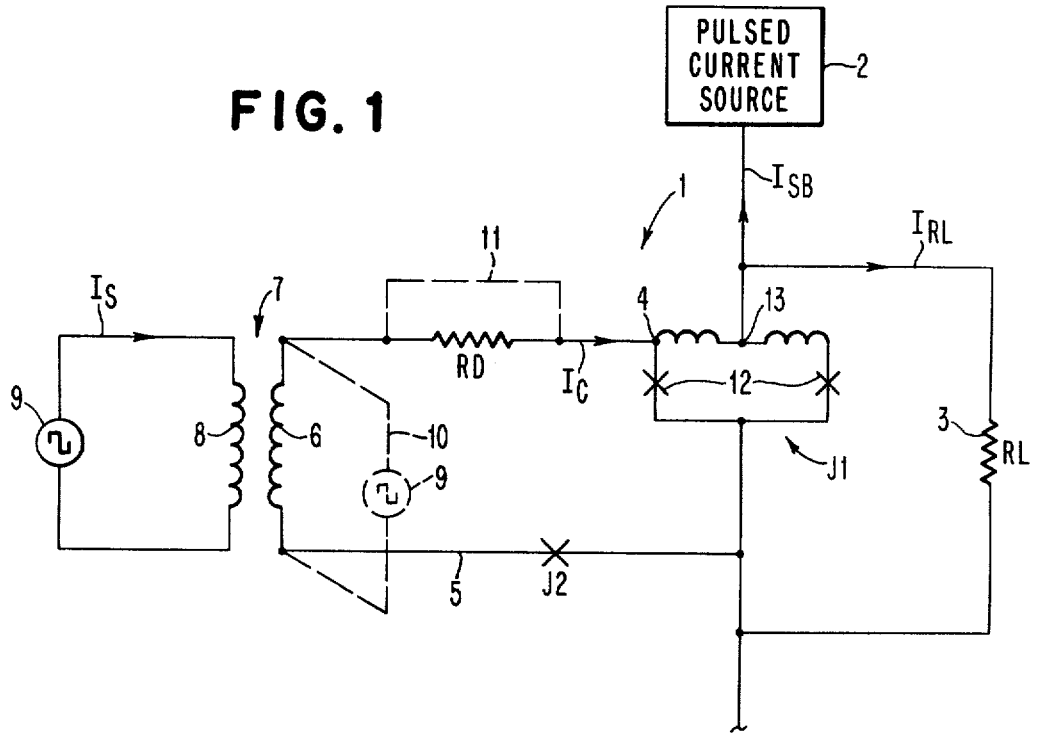
FIG. 1 is a schematic diagram of a waveform transition sensitive circuit in accordance with the teaching of the present invention, which diverts current flowing in a given direction in a current injection interferometer into an output load impedance when one of the current transitions of an input pulse provides a current which is additive with the current already flowing in the interferometer.

A switchable device J2 which is capable of carrying Josephson current is serially disposed in current path 5 along with a resistance RD and a secondary winding 6 of a pulse transformer 7. A primary winding 8 of pulse transformer 7 is connected to a pulsed signal current source 9. Pulsed signal current source 9 in an alternative arrangement, may be connected directly to secondary winding 6 as shown in FIG. 1 via dashed lines 10. Resistor RD, while not necessary for the operation of circuit 1, is a preferred approach and is present to damp out stray circulating currents which may be set up in current path 5. In an alternative embodiment, resistor RD may be removed and a short substituted therefor as indicated by dashed lines 11 in FIG. 1.

Waveform transition sensitive circuit 1 is, of course, intended to operate at helium temperature, (approximately 4.2° Kelvin) and, as such, pulse transformer 7, current path 5 and devices J1, J2 are fabricated from materials which are superconductive at the temperature of liquid helium. Resistor RD and load impedance RL are made of materials which are normal at the temperature of liquid helium. Pulsed current source 2 and pulsed signal current source 9 may operate within or without the liquid helium environment. Switchable device J2 may be any well known in-line gate or interferometer which is adapted to switch from its zero voltage state to its voltage state when its gate current exceeds the threshold of the device. Interferometer J1 has been characterized as a current injection interferometer but it may be any other well known in-line Josephson device or interferometer. Interferometer J1 is, however, preferably a current injection interferometer because such devices provide an amplified output signal not obtained utilizing well known prior art Josephson devices. The structure and operation of devices like interferometer J1 is discussed in detail in a copending patent application entitled "Two Port Current Injection Interferometer Amplifiers and Logic Circuits", Ser. No. 811,733 filed June 30, 1977 and assigned to the same assignee as the present application. Briefly, devices like interferometer J1 have nonlinear switching or threshold characteristics. The nonlinear threshold characteristic is achieved in a preferred mode by applying an injection current to the interferometer at a point on the interferometer which is different from where its gate current is normally applied. The resulting nonlinearity provides for high amplification. In FIG. 1, interferometer J1 is shown to have two junctions 12 and injection or transition current $I_C$ is introduced at injection terminal 4; a point on interferometer J1 which is different from a point 13 where the gate current $I_{SB}$ is introduced.

Typical Josephson junctions and interconnection circuitry which may be utilized in the practice of the present invention are shown in U.S. Pat. No. 3,758,795, Ser. No. 267,841, filed June 30, 1972 and assigned to the same assignee as the present invention.

A typical fabrication technique for forming Josephson junction devices is shown in U.S. Pat. No. 3,849,276, Ser. No. 125,993 filed Mar. 19, 1971. Load impedance 3 and resistor RD which must not be superconductive at the circuit operating temperature may be fabricated with compatible materials which display resistance at the desired operating temperature. U.S. Pat. No. 3,913,120, Ser. No. 429,461 filed Dec. 28, 1973 and assigned to the same assignee as the present invention shows a material and method of fabrication for circuitry and a terminating resistor which may be utilized in the practice of the present invention.

The operation of the circuit of FIG. 1 may be best understood by considering FIG. 1 in combination with FIGS. 2A-2D. FIGS. 2A-2D show respectively the current waveform $I_S$ generated by pulsed signal current source 9 and applied to primary winding 8 of pulse transformer 7; the current waveform $I_{SB}$ applied to current injection interferometer J1 from pulsed current source 2; the output current waveform $I_{RL}$ developed in load impedance 3 and, the waveforms of transition currents $I_C$ flowing in current path 5 of circuit 1.

Assuming for purposes of exposition, that interferometer J1 and device J2 are in their zero voltage state, waveform transition sensitive circuit 1 operates in the following manner. Pulsed current source 2 which may be any well known pulsed current source is triggered and provides a current pulse having a wave form similar to wave form 20 of FIG. 2B. This results in gate current $I_{SB}$ flowing into interferometer J1 which is in its zero voltage state inasmuch as it is designed not to switch to its voltage state until a current greater than current $I_{SB}$ flows into interferometer J1. At some time after gate current $I_{SB}$ is established, pulsed signal current source 9 is triggered causing a current $I_S$ to flow in primary winding 8 of transformer 7 which has a waveform similar to waveform 21 of FIG. 2A. Current waveform 21 is, of course, applied via secondary winding 6 of transformer 7 to current path 5 where current $I_C$ having a waveform similar to waveform 22 in FIG. 2D is obtained. When current $I_S$ of FIG. 2A begins to rise, current $I_C$ of FIG. 2D similarly rises. Switchable Josephson device J2 encounters the rising transition current $I_C$ as its gate current and switches from its zero voltage state to its voltage state at a predetermined threshold value. This threshold value is less than the threshold value at which interferometer J1 switches and, in a preferred mode, device 12 has a threshold value which is half that of the threshold of interferometer J1. Once device J2 switches, transition current $I_C$ drops abruptly to zero as shown at 23 in FIG. 2D. In the mode being described, transition current $I_C$ is shown in FIG. 1 flowing into injection terminal 4. Transition current $I_C$ then passes through junctions 12 in a direction opposite to the direction of gate current $I_{SB}$ which is already flowing in interferometer J1. Currents $I_C$ and $I_{SB}$ are flowing in opposite directions and subtract from one another effectively reducing the instantaneous flow of current in interferometer J1 and insuring that its threshold will not be exceeded. Interferometer J1, therefore, does not switch and no current is delivered to load impedance 3. As can be seen from FIG. 2C load current $I_{RL}$ is zero when transition current wave form 22 of FIG. 2D is present.

With gate current $I_{SB}$ still flowing in interferometer J1 and pulsed signl current $I_S$ still being applied, device J2 resets to its zero voltage state as a result of the current $I_C$ dropping to zero when device J2 switched to its voltage state. Because of the circuit parameters involved which will be specifically disclosed hereinafter, current $I_C$ could again rise until the threshold of device J2 is again exceeded. To the extent that current $I_C$ ultimately rises to a value which is insufficient to again cause the switching of Josephson device J2. In other words, $I_C$ can have a non-zero value after device J2 resets. Because of this, the amplitude of transition current $I_C$ could show a departure from zero but, for purposes of simplification, the situation where the threshold of device J2 and the maximum value of $I_S$ are the same is shown.

However, when pulsed signal current $I_S$ drops off at the end of time period T as shown in FIG. 2A, transition current $I_C$ follows the transition as shown by waveform 24 in FIG. 2D and, when the threshold value of device J2 is exceeded, it switches to its voltage state, causing $I_C$ to return to zero as shown at 25 in FIG. 2D. The falling current $I_S$ sets up a transition current $I_C$ which is opposite in direction to that shown in circuit path 5 of FIG. 1. Transition current $I_C$ now flows out of injection terminal 4 and interferometer J1 encounters a gate current $I_{SB}$ and a transition current $I_C$ which are both in the same direction. As a result, interferometer J1 encounters a current which is greater than its threshold current and switches to its voltage state diverting current into load impedance RL in the form of $I_{RL}$ as shown by waveform 26 in FIG. 2C. From the foregoing, it can be seen that an output is delivered to load impedance 3 on only one of the current transitions of a current pulse supplied by pulsed signal current source 9. To the extent that the waveforms shown in FIGS. 2A, 2B are repetitive, circuit 1 of FIG. 1 operates in the manner just described for each current pulse 20 and signal current pulse 21 applied. In the usual case, load impedance 3 has a value of resistance which is sufficient to render interferometer J1 latching. Thus, current $I_{RL}$ is delivered to load impedance 3 as long as interferometer J1 remains latched and interferometer J1 remains latched until current $I_{SB}$ returns to a zero value as shown at point 27 in FIG. 2B. Waveform 20 in FIG. 2B can have an opposite polarity as shown at 28 in FIG. 2B without departing from the spirit of the present invention. Under such circumstances, current is delivered to load impedance 3 as shown by waveform 29 in FIG. 2C. Transition current waveforms $I_C$, as shown in FIG. 2D do not change except that the current additions and subtractions are reversed in interferometer J1.

While load impedance 3 normally has a value of resistance which renders interferometer J1 latching, load impedance 3 could equally well have a value which would render interferometer J1 nonlatching so that it would reset to its zero voltage state as soon as transition current $I_C$ returns to zero. Such a technique would be applicable where current source 2 is neither a unipolar pulsed source nor a bipolar pulsed source but is a source of direct current. While it has not been mentioned above, it should be obvious that signal current source 9 may be bipolar in character without departing from the spirit of the present invention. Finally, to the extent that circuit 1 is immune to stray circulating currents in current path 5, resistor RD can be removed and the short shown by dashed line 11 in FIG. 1 substituted for it.

Figure 3:
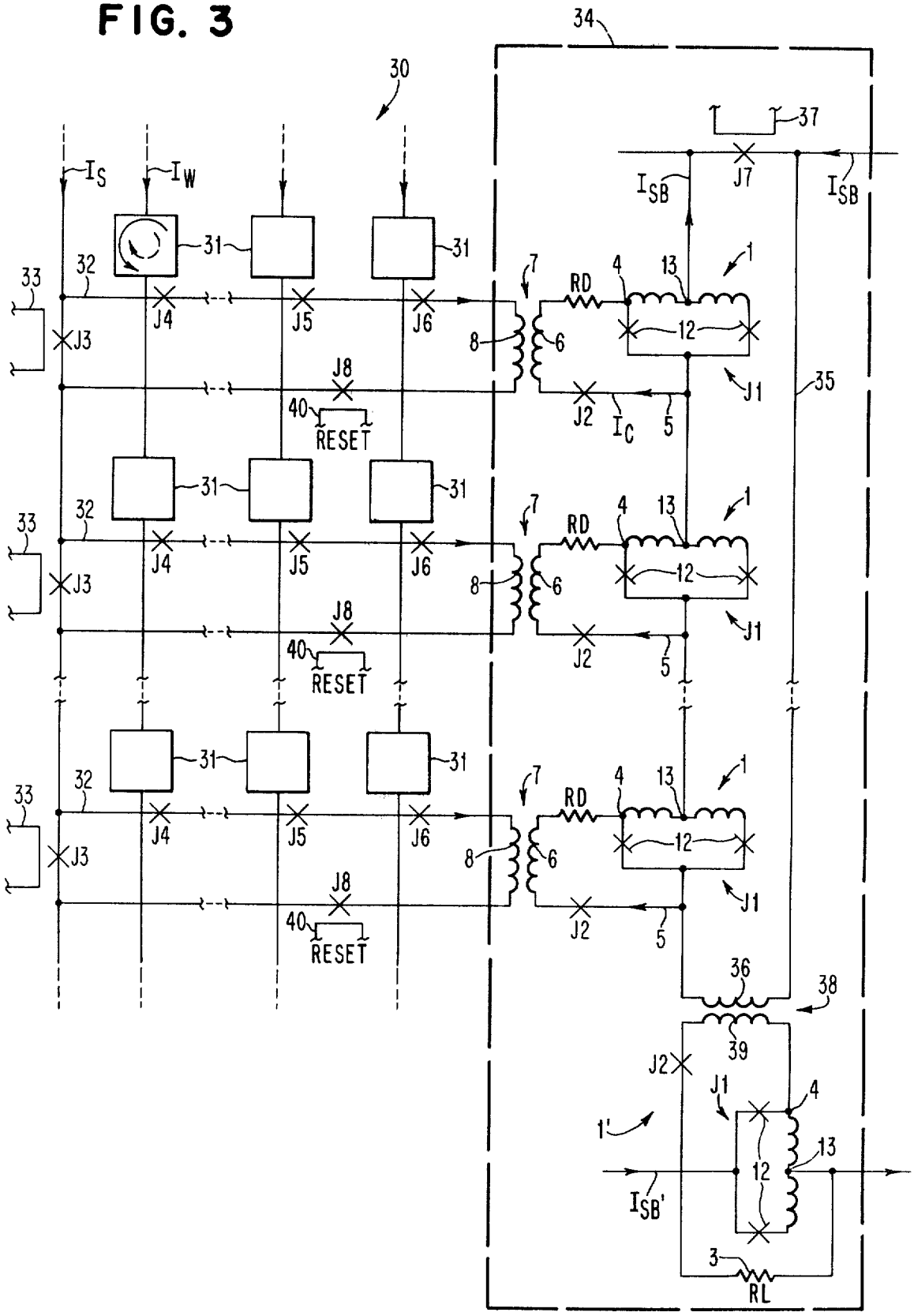
FIG. 3 is a schematic diagram showing a random access array of superconducting memory cells and the sense lines associated with a plurality of rows of the memory cells. The output of the sense lines when a particular memory cell is selected is applied as an input to a circuit similar to that shown in FIG. 1 which, in cooperation with a plurality of serially connected similar circuit, acts as a sense bus for the memory array.

Referring now to FIG. 3, there is shown therein a schematic diagram of a random access array of superconducting memory cells and the sense lines associated with a plurality of rows of the memory cells. The output of the sense lines, when a particular memory cell is selected is applied, as an input signal current to a waveform transition sensitive circuit 1 similar to that shown in FIG. 1. This input which is a pulsed waveform similar to that shown in FIG. 2A causes a circuit 1 of FIG. 3 to operate in the same manner as described in connection with FIG. 1.

Referring now to FIG. 3 in more detail, the elements in FIG. 3 which are the same as the elements of FIG. 1 have been designated with the same reference characters. In FIG. 3, an array 30 of memory cells 31 is shown which includes only that portion of a memory array required for reading information stored in the form of at least a single circulating current in memory cells 31. Memory cells 31 may be any well known type of superconducting memory cell which utilizes a storage device in the form of a Josephson junction disposed in a superconducting loop. When current $I_W$ is applied to a column of serially disposed memory cells 31 at the same time bit current (not shown) is applied, a storage Josephson junction (not shown) in one branch of a superconducting loop switches steering current $I_W$ into the other branch of the loop. When the bit current is removed, the storage device resets to its zero voltage state, but current $I_W$ continues to flow in the branch of the superconducting loop into which it was diverted. When current $I_W$ is removed, flux conservation in the loop requires that the current be distributed around the superconducting loop and a persistent, circulating current in one direction flows in the superconductive loop of a selected memory cell 31. By applying a current $I_W$ which is opposite to that previously applied, a circulating current opposite to that previously set up is stored in the superconducting loop of a selected memory cell 31. In this way, circulating currents representing binary "1" and binary "0" are obtained. Other memory cells which are representative of the type which utilize at least a single circulating current to represent binary information are shown in a copending application entitled "Superconducting Memory Array Configurations Which Avoid Spurious Half-Select Condition in Unselected Cells of the Array," Ser. No. 853,955, filed Nov. 22, 1977.

Recognizing that storing information in the form of circulating current is well known, it can be assumed that each of the memory cells 31 of array 30 in FIG. 3 is storing binary information in the form of counter-rotating circulating currents. The presence of these currents is normally detected by the use of a Josephson junction sense gate, one of which is placed in close proximity to a branch of the superconducting loop of memory cells each of 31. In FIG. 3, sense gates J4–J6 perform the function of detecting the presence of at least one of the circulating currents for each row of memory cells 31 of array 30. Sense gates J4–J6 are connected in series by means of a sense line 32 which is connected in parallel with a switchable Josephson device J3. Each of switchable devices J3 may be actuated by current flow in decoder output control lines 33 associated with each switchable device J3. Assuming that upper leftmost decoder control line 33 actuates switchable device J3, current $I_S$ is diverted into uppermost sense line 32 where it acts as gate current for sense gates J4–J6. Simultaneously with the application of current $I_S$ to sense gates J4–J6, current $I_W$ is applied to the leftmost column of memory cells 31. Recalling that a counterclockwise circulating current is assumed to be flowing in upper leftmost memory cell 31, sense gate J4 encounters its own gate current $I_S$, $I_W/2$ (where the inductances of each branch of the superconducting loop are identical) and a circulating current also equal to $I_W/2$. Since the circulating current is counterclockwise and is equal and in opposition to the current flowing in the rightmost branch of the superconducting loop of memory cell 31, these currents effectively cancel providing no control current for sense gate J4 and leaving sense gate J4 in its zero voltage state. If, however, the circulating current in upper leftmost memory cell 31 were clockwise, the circulating current $I_W/2$ and the current $I_W/2$ due to the application of current $I_W$ during reading are additive and provide control current to sense gate J4 switching it to its voltage state and causing a reduction in current $I_S$ in uppermost sense line 32 of FIG. 3.

In the usual case, the drop in sense line current is detected by the switching of the Josephson device which is serially disposed in a sense bus. The sense bus is usually controlled by a driver to which clock signals must be applied and to an output AND gate which is similarly controlled by a different clocked input. The known sense bus approaches either suffer from critical timing problems, long access times, or false conditions which can latch the sense bus.

The sense bus of the present application shown within dashed line box 34 in FIG. 3 suffers from none of these difficiencies. Indeed, in addition to eliminating critical timing signals in the read operation, reducing access time and avoiding false operations, the present sense bus possesses the advantages of read signal amplification, designability with wide margins and significant reduction in access time.

The sense bus contained within dashed line 34 includes a bus 35 which has a plurality of waveform transition sensitive circuits 1 serially disposed therein. A primary winding 36 is also serially disposed in bus 35. A switchable Josephson device J7 disposed in parallel with winding 36 and circuits 1 acts as a driver to divert current $I_{SB}$ into bus 35 when a signal is applied to control line 37 which is disposed in electromagnetically coupled relationship with device J7. Once current $I_{SB}$ is established in sense bus 35, it flows in each of circuits 1 and in interferometers J1 thereof in exactly the same manner described in connection with FIG. 1. Now, instead of having a separate pulsed source for the pulsed signal current $I_S$, this current is provided, for example, by the switching of device J4 when current $I_S$ is flowing in sense line 32 and the memory cell 31 associated with sense gate J4 has been selected for read out. As indicated hereinabove, any changes in current in sense line 32 are communicated to circuits 1 via pulse transformers 7. Interferometer J1 of uppermost circuit 1 will then switch or not switch depending on the state of the selected memory cell 31. If interferometer J1 switches, this reduction in current $I_{SB}$ appears in winding 36 where it is communicated via pulse transformer 38 to a secondary winding 39 which is identical with secondary winding 6 of circuit 1 of FIG. 1. This change in current is intended to switch interferometer J1 of this waveform transition sensitive circuit designated as 1' in FIG. 3 delivering output current to its load impedance 3.

In operation, the sense bus shown within dashed box 34 of FIG. 3 operates as follows:

At the beginning of a read cycle, driver device J7 is switched to the voltage state by means of a signal on its associated control line 37 transferring current $I_{SB}$ into bus 35. Then, a signal on decoder output control line 33 switches an associated device J3 to its voltage state transferring current $I_S$ into a sense line 32. As current $I_S$ is transferred, the current rises causing a transition which is communicated to a current path 5 via pulse tranformer 7 of a waveform transition sensitive circuit 1. Under such circumstances, switchable Josephson device J2 switches but interferometer J1 does not inasmuch as the currents in interferometer J1 are arranged to be subtractive at this time. Thus, current $I_{SB}$ does not change. If the addressed memory cell 31 contains a clockwise circulating current when it is addressed, it causes sense gate J4 to switch, causing a transition in current $I_S$. This transition is communicated via pulse transformer 7 to current path 5 causing a device J2 to switch and, because the transition current $I_C$ is of the proper polarity, it adds with current $I_{SB}$ causing interferometer J1 to switch which, in turn, causes a transition in current $I_{SB}$. Waveform transition sensitive circuit 1' operates in the same manner just described inasmuch as it experiences a transition when driver device J7 transfers current into bus 35. This transition does not switch interferometer J1 of circuit 1' inasmuch as it induces a current which is subtractive with current $I_{SB}'$ which is now flowing in circuit 1'. The transition caused by the switching of one of the interferometers J1 in bus 35 causes a transition which is communicated to circuit 1' as an additive current to current $I_{SB}'$ in circuit 1'. When currents $I_S$, $I_{SB}$ and $I_{SB}'$ are reduced to zero in the manner shown in FIGS. 2A, 2B, all currents are removed and devices J3, J7 and device J1 of current 1' are reset to their zero voltage state if they have been previously switched. In addition, devices J1 of circuits 1 of FIG. 3 are also reset. Finally, devices J8 in sense lines 32 are actuated via reset lines 40 to suppress any circulating currents which might be set up in sense lines 32.

Where the selected cell 31 contains a clockwise circulating current, its associated Josephson device J4 in uppermost sense line 32 does not switch and no transition is communicated to a waveform transition sensitive circuit 1 in bus 35; no transition occurs therein; no transition is detected by polarity sensitive circuit 1' and, there is no output to its load impedance 3.

In the manner just described, therefore, the sense bus circuit contained within dashed line box 34 of FIG. 3 is able to distinguish between two kinds of information stored in a memory cell 31 and provide outputs which reflect the state of a selected memory cell.

Figure 4:
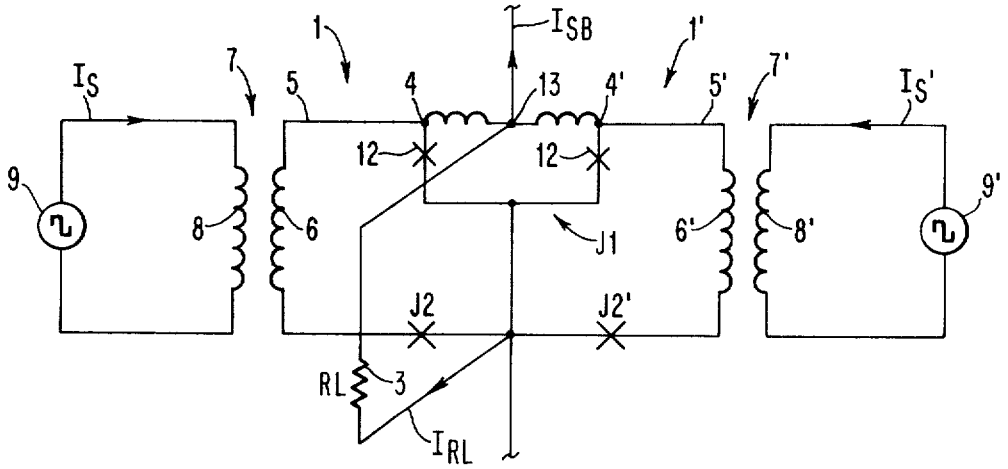
FIG. 4 is a schematic diagram of a pair of waveform transition sensitive circuits similar to that shown in FIG. 1 wherein each of the waveform transition sensitive circuits shares a common interferometer device and a common load impedance. A pair of inputs are applied via a pair of pulse transformers to permit logic functions such as AND, OR to be carried out.

Referring now to FIG. 4, there is shown therein a schematic diagram of a pair of waveform transition sensitive circuits similar to that shown in FIG. 1, wherein each of the waveform transition sensitive circuits shares a common interferometer device and a common load impedance. A pair of inputs are applied via a pair of pulsed transformers to permit logic functions such as AND, OR to be carried out.

Referring now to FIG. 4 in more detail, circuit 1 is identical with circuit 1 of FIG. 1 and each of the elements of FIG. 4 corresponding to the elements in FIG. 1 have the same reference characters. Circuit 1' of FIG. 4 is identical with polarity sensitive circuit 1 of FIG. 4 and the same elements except the common elements of circuit 1' have the same reference characters except that they are primed to distinguish them from the unprimed identical elements. Based on what has been discussed in connection with FIGS. 1 and 3, it should be clear that interferometer J1 can be switched by providing an input current $I_S$ or $I_S'$ from pulsed signal current sources 9 or 9'. Under such circumstances, if an output is delivered to load impedance 3, that output is representative of an OR function having been carried out. If the threshold of interferometer J1 is adjusted so that it will not switch until properly directed transition currents are supplied by both pulsed signal current sources 9, 9', an AND function is carried out when load impedance 3 experiences current $I_{RL}$.

While only a pair of circuits 1, 1' have been shown in FIG. 4, it should be clear that a greater number of waveform transition sensitive circuits can be utilized without departing from the spirit of the present invention. In this way, other logic functions well known to those skilled in the art of logic circuitry may be carried out. Thus, interferometer thresholds, amplitudes of input pulses and biases may be adjusted to provide other logic functions such as NAND and NOR.

The following are typical circuit parameters utilized in a circuit like that shown in FIG. 1.

$I_{SB}$=0.33 mA $I_{SB}$=0.20 mA

Inductance of primary winding 8=70 pH
Inductance of secondary winding 6=70 pH
Mutual inductance of pulse transformer 7=63 pH
Inductance of J1 between point 13 an each of junctions=2 pH
RD=0.01 ohm
RL for latching circuits=10.0 ohms
RL for self-resetting circuits=0.50 to 0.75 ohms
Io of J2=0.15 mA.
Io of junction 12 0.20 mA, where Io is the critical current of junction 12.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A waveform transition sensitive circuit comprising:
a device capable of carrying Josephson current,
a current source connected to said device to provide current flow therein of a given polarity,
a utilization circuit connected to said device,
at least a source of current pulses each of said pulses undergoing at least a pair of waveform transitions, and
means connected to said device and said at least a source of current pulses responsive to said at least a pair of waveform transitions for generating at least transition currents of said given polarity and of a polarity opposite to said given polarity in said device to switch it and deliver said current to said utilization device when said current in said device and a transition current of said at least transition currents are of the same polarity.

2. A waveform transition sensitive circuit according to claim 1 wherein said utilization circuit includes a load impedance shunting said device.

3. A waveform transition sensitive circuit according to claim 1 wherein said utilization circuit includes a transformer winding element disposed in series with said device said transformer winding element and said device being connected to said current source.

4. A waveform transition sensitive circuit according to claim 1 wherein said device is an in line gate.

5. A waveform transition sensitive circuit according to claim 1 wherein said device is an interferometer.

6. A waveform transition sensitive circuit according to claim 1 wherein said device is current injection interferometer.

7. A waveform transition sensitive circuit according to claim 1 wherein said current source is a source of direct current.

8. A waveform transition sensitive circuit according to claim 1 wherein said current source is a source of unipolar current pulses.

9. A waveform transition sensitive circuit according to claim 1 wherein said current source is a source of bipolar current pulses.

10. A waveform transition sensitive circuit according to claim 1 wherein said source of current pulses includes a source of unipolar current pulses.

11. A waveform transition sensitive circuit according to claim 1 wherein said source of current pulses includes a source of bipolar current pulses.

12. A waveform transition sensitive circuit according to claim 1 wherein said source of current pulses is a current sensing circuit which includes a sense line, a plurality of switchable devices capable of carrying Josephson current disposed in series in said sense line, each of said switchable devices being actuated by current flow in an associated memory cell, a sense current source connected to said sense line, a controllable switchable Josephson device connected in series with said current source and in parallel with said sense line and transformer means connected in series with said plurality of switchable devices.

13. A waveform transition sensitive circuit according to claim 1 wherein said means for generating transition currents includes at least a current path shunting said device, transformer means disposed in said at least a current path connected to said at least a source of current pulses and, at least a switchable device capable of carrying Josephson current disposed in said at least a current path which switches each time it encounters a waveform transition.

14. A waveform sensitive circuit according to claim 1 wherein said means for generating transition currents includes a pair of current paths shunting said device, tranformer means disposed in each of said pair of current paths connected to said at least a source of current pulses and a switchable device capable of carrying Josephson current disposed in each of said pair of current paths which switches each time it encounters a waveform transition.

15. A waveform transition sensitive circuit according to claim 2 wherein said load impedance is a resistance of ohmic value sufficient to render said device latching.

16. A waveform transition sensitive circuit according to claim 2 wherein said load impedance is a resistance of ohmic value sufficient to render said device self-resetting.

17. A waveform transition sensitive circuit according to claim 3 further including a driver device capable of carrying Josephson current disposed in series with said current source and in parallel with said device and said transformer winding element.

18. A waveform transition sensitive circuit according to claim 13 further including a resistor disposed in series in said at least a current path.

19. A waveform transition sensitive circuit according to claim 13 wherein the threshold current of said device is greater than the threshold current of said at least a switchable device.

20. A waveform transition sensitive circuit according to claim 14 further including a resistor disposed in series in each of said pair of current paths.

21. A waveform transition sensitive circuit according to claim 14 wherein the threshold current of said device is greater than the threshold current of said at least a switchable device.

22. A waveform transition sensitive circuit according to claim 17 wherein said transformer winding element is the primary of a transformer the secondary of which is in a current path disposed in parallel with another device similar to said device.

23. A waveform transition sensitive circuit according to claim 19 wherein the threshold current of said device is twice the threshold current of said at least a switchable device.

24. A waveform transition sensitive circuit according to claim 21 wherein the threshold current of said device is twice the threshold current of said at least a switchable device.

25. A waveform transition sensitive circuit comprising:

a sense bus, a plurality of devices capable of carrying Josephson current disposed in series in said sense bus, a current source connected to said plurality of devices to provide current flow therein of a given polarity, a utilization circuit connected to said plurality of devices, a plurality of sources of current pulses each of said pulses undergoing a pair of waveform transitions, and means connected between each of said plurality of devices and each one of said plurality of sources of current pulses, respectively, responsive to said pair of waveform transitions for generating transition currents of said given polarity and of a polarity opposite to said given polarity in each of said devices to switch it and deliver said current to said utilization device when said current in each of said devices and a transition current are of the same polarity.

26. A waveform transition sensitive circuit according to claim 25 wherein each of said plurality of sources of current pulses is a current sensing circuit which includes sense line, a plurality of switchable devices capable of carrying Josephson current disposed in series of said sense line, each of said switchable devices being actuated by current flow in an associated memory cell, a current source connected to said sense line, a controllable switchable Josephson device connected in series with said current source and in parallel with said sense line and transformer means connected in series with said plurality of switchable devices.

27. A waveform transition sensitive circuit according to claim 26 wherein said means for generating transition currents includes a current path shunting each of said plurality of devices, transformer means disposed in each said current path and in electromagnetically coupled relationship with said first mentioned transformer means and, a switchable device capable of carrying Josephson current disposed in said current path adapted to switch each time it encounters a waveform transition.

28. A waveform transition sensitive circuit according to claim 27 wherein said utilization circuit includes a transformer winding element disposed in series with said plurality of devices, said transducer element and said plurality of devices being connected to said current source.

29. A waveform transition sensitive circuit according to claim 28 further including a driver device capable of carrying Josephson current disposed in series with said current source and in parallel with said plurality of devices, said sense bus and said transformer winding element.

30. A waveform transition sensitive circuit according to claim 29 wherein said transformer winding element is the primary of a transformer the secondary of which is in another current path disposed in parallel with a device similar to each of said plurality of devices.

31. A waveform transition sensitive circuit according to claim 30 further including a switchable device capable of carrying Josephson current disposed in said another current path adapted to switch each time it encounters a waveform transition, a current source connected to said a device similar to each of said plurality of devices to provide current flow of given polarity therein and a utilization circuit connected to said device similar to each of said plurality of devices.

32. A waveform transition sensitive circuit according to claim 31 wherein the threshold current of each of said plurality of devices is twice the threshold current of each of said plurality of switchable devices.

33. A waveform transition sensitive circuit according to claim 31 futher including a resistor disposed in series in said current path.

*34. A logic circuit comprising:*

*a device capable of carrying Josephson current,*

*a current source directly connected to said device to provide all of a first current from said source to said device,*

*a utilization circuit connected to said device,*

*a current path shunting said device said current path including a serially arranged resistor and another device capable of carrying Josephson current, and,*

*means directly connected to said current path for generating a second current in said device and in said another device to switch said devices and deliver at least said first current to said utilization circuit and interrupt at least said second current in said another device.*

*35. A logic circuit according to claim 34 wherein said means for generating is a source of current pulses directly connected to said current path.*

*36. A logic circuit comprising:*

*a device capable of carrying Josephson current,*

*a current source directly connected to said device to provide all of a first current from said source to said device,*

*a utilization circuit connected to said device,*

*a current path shunting said device said path including another device capable of carrying Josephson current, and,*

*means directly connected to said current path for generating a second current in said device and in said another device to switch said devices and deliver at least said first current to said utilization circuit and interrupt at least said second current in said another device.*

*37. A logic circuit according to claim 36 wherein said means for generating is a source of current pulses directly connected to said current path.*

*38. A logic circuit comprising:*

*a device capable of carrying Josephson current,*

*a current source connected to said device to provide a first current in said device,*

*a utilization circuit connected to said device,*

*a current path shunting said device said current path including a serially arranged resistor and another device capable of carrying Josephson current, and,*

*means directly connected between said resistor and said another device for generating a second current in said device and in said another device to switch said devices and deliver at least said first current to said utilization circuit and interrupt at least said second current in said another device.*

*39. A logic circuit according to claim 38 wherein said means for generating is a source of current pulses directly connected between said resistor and said another device.*

*40. A logic circuit comprising:*

*a device capable of carrying Josephson current,*

*a current source directly connected to said device to provide all of a first current from said source to said device,*

*a utilization circuit connected to said device,*

*a current path shunting said device said current path including an inductance and another device capable of carrying Josephson current, and,*

*means directly connected between said inductance and said another device for generating a second current in said device and in said another device to switch said devices and deliver at least said first current to said utilization circuit and interrupt at least said second current in said another device.*

*41. A logic circuit according to claim 40 wherein said means for generating is a source of current pulses directly connected to said another device.*

*42. A logic circuit comprising:*

*a device capable of gain and capable of carrying Josephson current,*

*a current source connected to said device to provide all of a first current from said source to said device,*

*a utilization circuit connected to said device,*

*a current path shunting said device said current path including another device capable of carrying Josephson current, and,*

*means directly connected to said current path for generating a pulsed control current in said current path so that in said device said first current and said control current add causing said device and said another device to switch delivering at least said first current to said utilization circuit.*

*43. A logic circuit according to claim 42 wherein said current source is directly connected to said device.*

*44. A logic circuit according to claim 42 further including a resistor disposed in said current path in series with said another device.*

*45. A logic circuit according to claim 44 wherein said means for generating a pulsed control current is connected between said resistor and said another device.*

* * * * *